United States Patent
Tarrant et al.

(10) Patent No.: US 7,608,565 B2
(45) Date of Patent: Oct. 27, 2009

(54) METHOD OF MANUFACTURING DOPED SUPERCONDUCTING MATERIALS

(75) Inventors: Colin David Tarrant, Rushton House, Chester Road, Kelsall, Cheshire CW6 0RT (GB); Kelvin Robert Schneider, 37 Barton Hey Drive, Caldy, Wirral CH48 1PZ (GB); David Anthony Cardwell, Huntingdon (GB); Nadendla Hari Babu, Cambridge (GB)

(73) Assignees: Colin David Tarrant, Chesire (GB); Kelvin Robert Schneider, Wirral (GB)

( * ) Notice: Subject to any disclaimer, the term of this patent is extended or adjusted under 35 U.S.C. 154(b) by 462 days.

(21) Appl. No.: 10/560,284

(22) PCT Filed: Jun. 7, 2004

(86) PCT No.: PCT/GB2004/002417

§ 371 (c)(1),
(2), (4) Date: Jan. 24, 2006

(87) PCT Pub. No.: WO2004/111317

PCT Pub. Date: Dec. 23, 2004

(65) Prior Publication Data

US 2006/0124050 A1   Jun. 15, 2006

(30) Foreign Application Priority Data

Jun. 11, 2003   (GB) ................... 0313451.7

(51) Int. Cl.
*H01B 12/00* (2006.01)
*C04B 35/00* (2006.01)
(52) U.S. Cl. ............... 505/451; 505/781; 117/41
(58) Field of Classification Search ........... 505/124, 505/451, 781; 117/41, 42
See application file for complete search history.

(56) References Cited

U.S. PATENT DOCUMENTS 6,083,886 A * 7/2000 Hayashi et al. ............. 505/450
6,255,255 B1 * 7/2001 Morita et al. ............... 505/100

FOREIGN PATENT DOCUMENTS

EP   0 890 661 A1   1/1999

(Continued)

OTHER PUBLICATIONS

Paulose et al "Synthesis of Ba2YZrO6: A new phase in YBa2Cu3O7-ZrO2 system . . . ", Solid State Comm, vol. 83, No. 12, pp. 985-988 (1992).*

(Continued)

*Primary Examiner*—Mark Kopec
(74) *Attorney, Agent, or Firm*—Squire, Sanders & Dempsey L.L.P.

(57) ABSTRACT

The invention provides a method of manufacturing a doped i X—Ba—Cu—O material, the method comprising the steps of: a) mixing an X—Ba—L—O or X—Ba—Cu—L—O material with an X—1 Ba—Cu—O material; and b) crystallising the mixture; 1 wherein each X is independently selected from a rare earth (Group IIIB) element, yttrium, a combination of rare earth elements, or a combination of yttrium and a rare earth element; and L is selected from U, Nb, Ta, Mo, W, Zr, Hf, Ag, Pt, Ru and Sn. The invention further provides a doped material manufactured by the method of the invention.

18 Claims, 3 Drawing Sheets

FOREIGN PATENT DOCUMENTS

WO    WO2007/007104    *    1/2007

OTHER PUBLICATIONS

Carrillo et al "BaZrO3 and YBa2ZrO5.5 Additions in Melt Textured YBa2Cu3O7-y . . . ", Inst. Phys. Conf Ser No. 167, Paper Presented at Applied Superconductivity, Spain Sep. 14-17, 1999, pp. 123-126.*
Paulose et al "Preparation and Properties of Ba2YZrO6-YBa2Cu3O7 Composites", Solid State Comm. vol. 87, No. 2, pp. 147-150 (1993).*
Weinstein et al, "A class of chemical pinning centers including two elements foreign to HTS" Physica C, vol. 383, No. 4, Jan. 1, 2003, pp. 438-444, XP004399226.
Weinstein et al, "Very High values of Jc obtained in NdBa2Cu30x by use of the U/n process" Physica C., vol. 383, No. 3, Dec. 15, 2002, pp. 214-222, XP004391510.
Babu et al, "Effect of the addition of depleted U02 on the microstructure of melt processed Y-Ba-Cu-O superconductors" Physica C., vol. 372-376, Aug. 2002, pp. 1183-1186, Xp004375638.
Weinstein et al, "The role of uranium, with and without irradiation, in the achievement of Jc {300,000 A cm<-2> at 77 K in large grain melt-textured Y123", Materials Science and Engineering B, ElSevier Sequoia, vol. 53, No. 1-2, May 1, 1998, pp. 38-44, XP004139989.
Sawh R-P et al, "Uranium chemistry and pinning centers in high temperature superconductor", Physica C., vol. 305, No. 3-4, Sep. 1, 1998 pp. 159-166, XP004150793.
Weinstein et al, "Properties of HTS for Successful U/n Processing", Physica C, vol. 341-348, Nov. 2000, pp. 1415-1418, XP004315950.

* cited by examiner

METHOD OF MANUFACTURING DOPED SUPERCONDUCTING MATERIALS

FIELD OF THE INVENTION

This invention relates to methods of manufacturing doped superconductor material and material manufactured thereby.

BACKGROUND TO THE INVENTION

The process whereby bulk X—Ba—Cu—O material (where X equals a rare earth element such as Yb, Nd, Sm, Ho etc) high temperature superconductor (HTS) are manufactured has been the subject of considerable scientific development over the last ten years. Large grain bulk X—Ba—Cu—O materials have significant potential for generating large magnetic fields, in excess of those achievable with conventional permanent magnets, for a variety of engineering applications such as magnetic bearings, MRI and flywheel energy storage applications. Recent work has focused on doping bulk X—Ba—Cu—O with uranium oxide per se, with the uranium in various valancy states, in order to enhance the flux pinning, and hence current carrying properties of large grain bulk superconducting materials. These materials may be fabricated by a variety of processes including melt processes to produce large single grain composites. Techniques of growing the superconducting crystals are described in Volume 1, Section B2.4.3.3 of "The Handbook of Superconducting Materials" edited by Cardwell & Ginley, published by the Institute of Physics Publishing, UK. In the various melt processes available, precursor powders of X—Ba—Cu—O and $UO_2$ are mixed either mechanically or by a solution based technique in the required stoichiometric ratios and compacted into the required geometry by uniaxial or hot cold isotatic pressing, for example. A small seed crystal of compatible crystallographic and chemical structure is usually placed on a surface of the powder compact (typically the upper surface) and the arrangement heated to the peritectically molten (i.e. partially molten) state. Alternatively, the seed crystal may be added to the compacted powders at an elevated temperature, either before or after peritectic decomposition. The sample and seed crystal is then cooled slowly through the peritectic solidification temperature during which process a single grain nucleates at the seed position and grows substantially outwards from the seed position. The decomposition and subsequent material growth processes produces uranium-doped X—Ba—Cu—O crystals. This material is fully superconducting and consists typically of a continuous superconducting microstructure (often referred to as the '123 phase) that contains discrete inclusions of a non-superconducting phase (often referred to as the '211 phase). The ability of these materials to generate or trap magnetic flux correlates either directly or indirectly with the size and distribution of the second phase inclusions. Doping uranium into the material has a significant effect on the refinement of existing inclusions and the generation of new second phase particle inclusions. Results have shown that uranium-doped second phase particle inclusions produced by co-melting of $UO_2$ and X—Ba—Cu—O material have the general formula X—Ba—Cu—U—O. It has been demonstrated that the addition of uranium oxide per se has two key effects. These are:

a) the uranium acts as a refining agent or flux that produces a refined distribution of second phase inclusions with or without the presence of traditionally added platinum; the presence of uranium increases the achievable crystal growth rate; and b) uranium forms a new secondary phase of particles having the formula $X_2Ba_4CuUO_z$ of sub-micron size throughout the crystal structure.

Although the inclusion of $UO_2$ particles produces advantageous $X_2Ba_4CuUO_z$ particles, it is not possible using known techniques to predetermine size, number etc of the second phase particles within the crystal and the processing temperatures and times for manufacturing the crystal need to be carefully adjusted to ensure that second phase particles are formed in sufficient numbers to be advantageous. Furthermore, using processes such as top-seed melt processing to produce the uranium-doped crystals by adding $UO_2$, is relatively difficult and the conditions for processing need to be set within fairly limited range in order for the $UO_2$ and X—Ba—Cu—O crystals to be able to tolerate the required temperatures and times in which to form second phase particles within the final crystal.

It would therefore be advantageous to provide a method of manufacturing a uranium-doped X—Ba—Cu—O type material or a X—Ba—Cu—O material doped with other elements in which the size and number of second phase particles can be predetermined before the crystal is formed. It would furthermore be advantageous to provide a method which allows increased tolerance of the manufacturing conditions and parameters and which reduces processing temperatures and times to lower cost and increase optimisation of the crystal growth process.

It would furthermore be advantageous to produce a uranium-doped X—Ba—Cu—O crystal or a X—Ba—Cu—O crystal doped with other elements, for which the first phase particles produce even stronger magnetic fields than in known uranium-doped crystals and in which addition of further dopants may increase overall performance of the crystal. It would also be advantageous to provide a doped X—Ba—Cu—O type material in which the addition of platinum, currently used to refine the particle size of doped X—Ba—Cu—O crystals, can be dispensed with without any detrimental effect to the properties of the crystals produced.

It is therefore an aim of preferred embodiments of the present invention to overcome or mitigate at least one problem of the prior art whether expressly disclosed herein or not.

SUMMARY OF THE INVENTION

According to a first aspect of the invention there is provided a method of manufacturing a doped X—Ba—Cu—O material, the method comprising the steps of:

a) mixing an X—Ba-L-O or X—Ba—Cu-L-O material with an X—Ba—Cu—O material; and b) crystallising the mixture;

wherein, each X is independently selected from a rare earth (Group IIIB) element, yttrium, a combination of rare earth elements, or a combination of yttrium and a rare earth element; and each L is one or more elements selected from U, Nb, Ta, Mo, W, Zr, Hf, Ag, Pt, Ru and Sn.

By "X—Ba—Cu—O material", "X—Ba—Cu-L-O" material" and "X—Ba-L-O material" we mean compounds comprising said X, Ba, Cu, O and/or L elements whether only containing those elements or containing further elements as impurities or as part of said compounds.

Suitably the X—Ba—Cu-L-O and X—Ba-L-O material comprise material of general formula:

$$X_wBa_xCu_yL_tO_z,$$

wherein each X and L is as defined hereinabove; and wherein w is 1 to 4; x is 1 to 6; y is 0 to 4; t is 0.3 to 2; and z is 3 to 20

Suitably the X—Ba—Cu—O material comprises material of the general formula

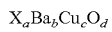
$X_aBa_bCu_cO_d$ wherein each X is as defined hereinabove, and wherein a is 1 to 4; b is 1 to 6; c is 0.5 to 4; d is 3 to 20.

Suitably each X is independently selected from one or more of yttrium, Nd, Sm, Gd, Eu or Ho, more preferably selected from one or both of yttrium and Nd, and most preferably each X is yttrium. Preferably each X is identical.

L is preferably uranium or a mixture of uranium and another element.

Preferably w is 1 to 3; preferably x is 2 to 4; preferably y is 0.1 to 1 for X—Ba—Cu-L-O materials, more preferably 0.3 to 1; preferably t is 0.5 to 1, more preferably 1; and preferably z is 4 to 15, more preferably 5 to 12 and most preferably 6 to 8.

Preferably a is 1 to 3; preferably b is 2 to 4; preferably c is 1 to 3, more preferably 1 or 3; preferably d is 4 to 15, more preferably 5 to 12 and most preferably 6 to 8.

Suitably the $X_aBa_bCu_cO_d$ is added in step a) to an amount of at least 50% w/w of the mixture, preferably at least 60% w/w, more preferably at least 70% w/w, still more preferably at least 80% w/w, and most preferably at least 90% w/w of the total weight of the mixture. In particularly preferred embodiments the $X_aBa_bCu_cO_d$ is added in an amount of at least 95% w/w, and especially at least 99% W/W.

In contrast suitably the $X_wBa_xCu_yL_tO_z$ is added in step a) to an amount of at least 0.01% w/w, preferably at least 0.05% w/w and more preferably at least 0.1% w/w of the total weight of the mixture produced in step a).

It has been found that $X_wBa_xCu_yL_tO_z$ may be added in amounts up to 30% w/w or even 40% w/w without detriment to the superconductors crystal while effecting stronger magnetic fields, than non-doped crystals.

Suitably the $X_wBa_xCu_yL_tO_z$ is a solid, and preferably a powder or granules.

The $X_aBa_bCu_cO_d$ may be any suitable physical state, which state may depend on the manner of crystallisation desired in step (b).

The $X_aBa_bCu_cO_d$ may be in molten or liquid form, and/or the method comprises a step prior to step (a) of substantially melting the $X_aBa_bCu_cO_d$. Alternatively the $X_aBa_bCu_cO_d$ may be in solid form, preferably in powder or granules form. Preferably the grain size of the powder or granules is at least 1 micron, and preferably the maximum grain size of the powder or granules is no more than 105 microns, more preferably no more than 75 microns.

Suitably step (b) comprises single crystal crystallisation.

Preferably step (b) comprises crystallisation of a mixture of $X_wBa_xCu_yL_tO_z$ in molten $X_aBa_bCu_cO_d$.

Crystallisation in step (b) may be effected by any suitable method.

Suitable methods of growing (crystallising) singe crystals including sintering, grain growth, flux growth, top-seeded growth, solution crystallisation, floating zone crystallisation, travelling solvent crystallisation, electrocrystallisation and hydrothermal growth. Each of these techniques in described in detail in Volume 1, Section B2.4.3.3 pages 354-359 of the "Handbook of Superconducting Materials", published by the United Kingdom Institute of Physics, edited by Cardwell & Ginley, the contents of which is incorporated herein by reference.

Preferably step (b) comprises providing in a receptacle a mixture of $X_aBa_bCu_cO_d$ and $X_wBa_xCu_yL_tO_z$; melting the mixture; providing a seed or key to the receptacle; and subsequently manipulating the temperature of, or in the region of, the seed or key, to induce crystallisation of the molten mixture.

Preferably powders of $X_aBa_bCu_cO_d$ and $X_wBa_xCu_yL_tO_z$ are mechanically mixed or mixed using a solution based technique, in the required stoichiometric ratio, and then suitably compacted into the required geometry, by for example, hot or cold isostatic pressing.

The $X_aBa_bCu_cO_d$ and $X_wBa_xCu_yL_tO_z$ may be added to the receptacle in solid form and the mixture melted. Alternatively the $X_aBa_bCu_cO_d$ may be melted in the receptacle and solid $X_wBa_xCu_yL_tO_z$ added to the molten material.

The seed or key may be added to the molten mixture or added prior to melting the mixture. Preferably the seed or key is added to powdered $X_aBa_bCu_cO_d$ and $X_wBa_xCu_yL_tO_z$ and the powdered mixture subsequently melted.

The seed or key is preferably a crystal of compatible crystallographic and chemical structure to the $X_aBa_bCu_cO_d$.

Suitable seed crystals include the same $X_aBa_bCu_cO_d$ material, and $X_aBa_bCu_cO_d$ material with a different X atom to the $X_aBa_bCu_cO_d$ material being crystallised, for example.

More preferably step (b) comprises top-seeded solution growth crystallisation (TSSG crystallisation), wherein $X_aBa_bCu_cO_d$ is melted to the required temperature, powdered $X_wBa_xCu_yL_tO_z$ is added to the molten mixture and a seed crystal arranged enter the molten mixture on a support member, the support member effecting the required temperature gradient to induce crystallisation around the seed crystal.

Suitably the mixture is melted to a peritectically molten state (i.e. partially molten state). Preferably the mixture of $X_aBa_bCu_cO_d$ and $X_wBa_xCu_yL_tO_z$ is heated to at least 900° C., more preferably at least 950° C. and most preferably at least 1000° C., in order to melt the mixture into the preferably, peritectically molten state (partially molten state). Suitably the mixture is heated to no more than 1200° C., preferably no more than 1150° C. and more preferably no more than 1100° C. to melt the mixture to the peritectically molten state (partially molten state).

Manipulation of the temperature is preferably effected by cooling the seed or key, or the region around the seed or key at a rate suitable to induce peritectic solidification of the mixture. Suitably cooling is effected at a rate of no more than 6° C. per hour, preferably no more than 5° C. per hour. Suitably cooling is effected at a rate of at least 0.05° C. per hour, preferably at least 0.075° C. per hour and more preferably at least 0.1° C. per hour.

The crystal growth may be effected under uniform thermal conditions, such as uniform temperature of the molten mixture, or may be effected under thermal gradient, in order to control the crystal growth rate.

The mixture maybe heated under air, oxygen-rich, or oxygen-depleted atmospheres in order to induce decomposition to the peritectically molten state.

The resultant uranium-doped X—Ba—Cu—O (XBCO) crystal is then preferably annealed at between 400° C. and 700° C., more preferably in an oxygen-rich atmosphere, preferably for between 100 and 300 hours, more preferably for substantially 200 hours. The annealing step enables transformation of the crystal to the superconducting state.

The resultant superconducting material is believed to consist of a continuous superconducting microstructure (often referred to as the "123" phase due to a $XBa_2Cu_3O_d$-structure) that contains discrete inclusions of a non-superconducting phase (often referred to as the "211" phase due to a $X_2BaCuO_5$-structure), and a second phase of X—Ba—Cu-L-O particle inclusions. The ability of this resultant material is to generate, or trap, magnetic flux correlates directly or indirectly to the exact size and distribution of the second phase inclusions of the 123 matrix. The method of doping described for the first aspect of the invention has a significant effect in the refinement of existing inclusions, and the generation of new second phase inclusions, to produce a superconducting material with properties superior to those displayed by similar materials manufactured by known prior art doping processes.

It has been found that the effect of adding $X_wBa_xCu_yL_tO_z$ particles to $X_aBa_bCu_cO_d$ provides (1) that the size and number of dopant-containing particles can be pre-determined for the resultant crystal, before the crystal is formed; (2) superior refinement of the inclusions within the resultant crystal is effected to effect stronger magnetic fields within the structure, compared to crystals produced by known uranium-doping processes; (3) that the top seed processing procedure is simplified and accelerated compared to known processes; and (4) temperature of the crystal growing process can be optimised, and pre-planned, leading to superior quality, and superior effect, crystals.

The method may comprise mixing $Y_2O_3$ with the mixture produced in step a). The method may comprise adding Pt to the mixture produced in step a), but is not necessary due to the enhanced properties of the material produced by the method of the invention.

According to a second aspect of the invention there is provided a doped material manufactured by the method of the first aspect of the invention.

BRIEF DESCRIPTION OF THE DRAWINGS

For a better understanding of the various aspects of the invention and to show how embodiments of the same may be put into effect, the invention will now be described by way of the accompanying drawings in which.

DESCRIPTION OF THE PREFERRED EMBODIMENTS

Figure 1:
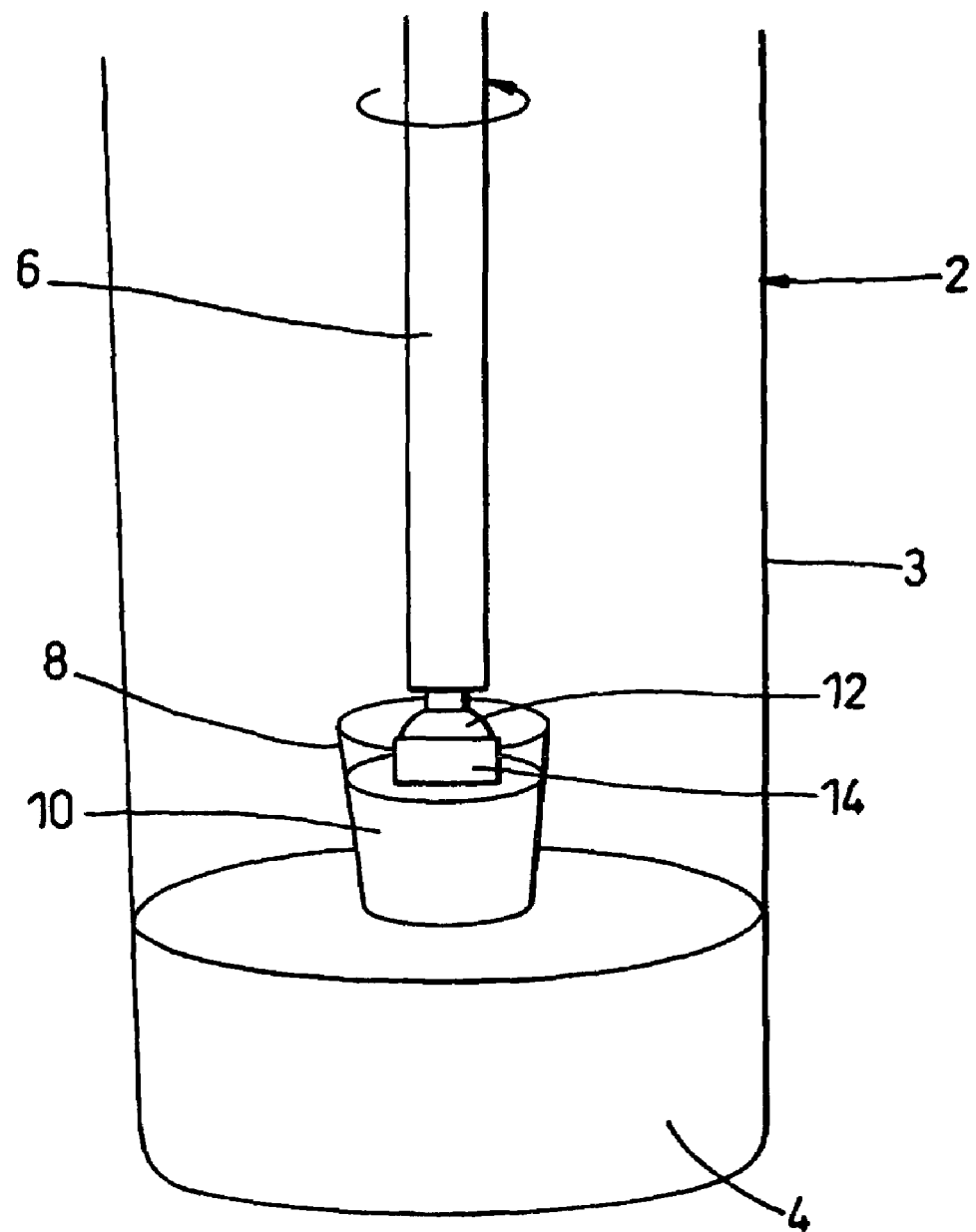
FIG. 1 illustrates a front sectional view of a top-seed melt apparatus, in which a single crystal of uranium-doped X—Ba—Cu—O or X—Ba—Cu—O doped with Nb, Ta, Mo, W, Zr, Hf, Ag, Pt, Ru and/or Sn can be crystallised, which apparatus is described in detail in Journal of Material Science Letters, 14, p 1444 (1995)

We refer firstly to FIG. 1.

A top-seed melt apparatus 2 consists of a pedestal 4 on which is mounted a furnace chamber 3, connected to heating means which enable heating to be effected within the furnace 3. Within the furnace chamber 3 is a seed holder arm 6 arranged to be located such that its distal end can be positioned within a melt receptacle 10 located on the pedestal 4. At the distal free end of the free arm is a seed crystal 12 that is arranged to be lowered into the melt receptacle 10 in use. The apparatus in FIG. 1 shows a growing crystal 14 connected to the seed crystal 12, growing in a melt solution present within the melt receptacle 10. The seed holder arm 6 is rotatable, and is such that rotation may be effected during growth of the crystal 14, in use. The airspace within the furnace 3 is a controlled atmosphere, in which the heat within the furnace may be adjusted as desired. The seed arm 6 is also movable upwardly and downwardly with respect of the pedestal 4, such that during growth of the crystal 14, the seed arm may be retracted slowly from the melt receptacle 10, in order that further growth of the crystal 14 may be effected and a continual temperature gradient of the seed 12 and crystal 14 effected in order to enable continued growth of the crystal 14.

In alternative embodiments of the apparatus 2, a cold finger may or may not be used to control grain nucleation and growth in the apparatus 2. Additionally, the seed crystal may be placed on an exposed surface of the precursor pellet compact at room temperature, rather than at elevated temperature after melting or partial melting.

EXAMPLE 1

An X—Ba—Cu—U—O material having a formula $Y_2Ba_4CuUO_z$ (hereinafter "DU") was synthesised by conventional techniques. Particles of $Y_2BaCuO_5$ (Y-211) were synthesised along with particles of $YBa_2Cu_3O_7$ (Y-123 particles), by a conventional solid state reaction technique.

The Y-123, Y-211 and DU powdered particles were, pressed into a compact pellet placed in the melt receptacle 10, and placed on the pedestal 4 of the top-seed melt apparatus 2 shown in FIG. 1. The Y-123, Y-211 and DU particles were in the following proportions: Y-123 70 mol %, Y-211 30 mol % and 0.5% w/w DU.

The powder constituents in the melt receptacle 10 were heated to a temperature of 1050° C., in order to melt the powdered mixture into a peritectically molten state.

A seed crystal was connected to the melt arm 6 of the top-seed melt apparatus 2. The internal airspace of the furnace 3 was kept at 1050° C. in order to heat the seed crystal to the same temperature as the melted constituents in the melt receptacle 10. the melt and seed 12 werethen cooled rapidly to 1010° C. The seed arm 6 was then lowered such that the seed crystal 12 just entered the molten mixture within the melt receptacle 8. The melt and seed were then cooled at a rate of 0.01 to 1° C. per hour in order to effect crystallisation of the melt 10 in the melt receptacle 8. As the seed 12 was cooled, the seed arm was rotated such that the crystal 14 formed from the melt 10 across the entire distal surface of the seed 12. Also during crystallisation the seed arm was gradually retracted such that the emerging crystal 14 was always kept with only a single surface and region around said surface in contact with the melt 10.

Upon complete crystallisation, the single crystal produced was then subjected to an oxygen rich atmosphere at a temperature of between 400° C. and 700° C. for 200 hours in order to anneal the crystal to enable transformation of the crystal to the superconducting state. The resultant superconducting material was shown to consist of a superconducting first phase microstructure of a Y-123 phase with contained discrete inclusions of a non-superconducting Y-211 phase and a second phase of DU-containing particles. The ability of the resultant crystal to generate, or maintain magnetic flux was found to be excellent, and greater than that of a traditionally manufactured uranium-doped superconducting XBCO crystal in which uranium dioxide is added to a melt of XBCO material. It is believed that the method of uranium-doping used in this example and this invention has a significant effect in refinement of existing Y-211 inclusions in the emerging superconducting crystal 14, to produce a superconducting material with properties superior to those displayed by similar materials manufactured by known prior art uranium-doping processes.

Figure 2:
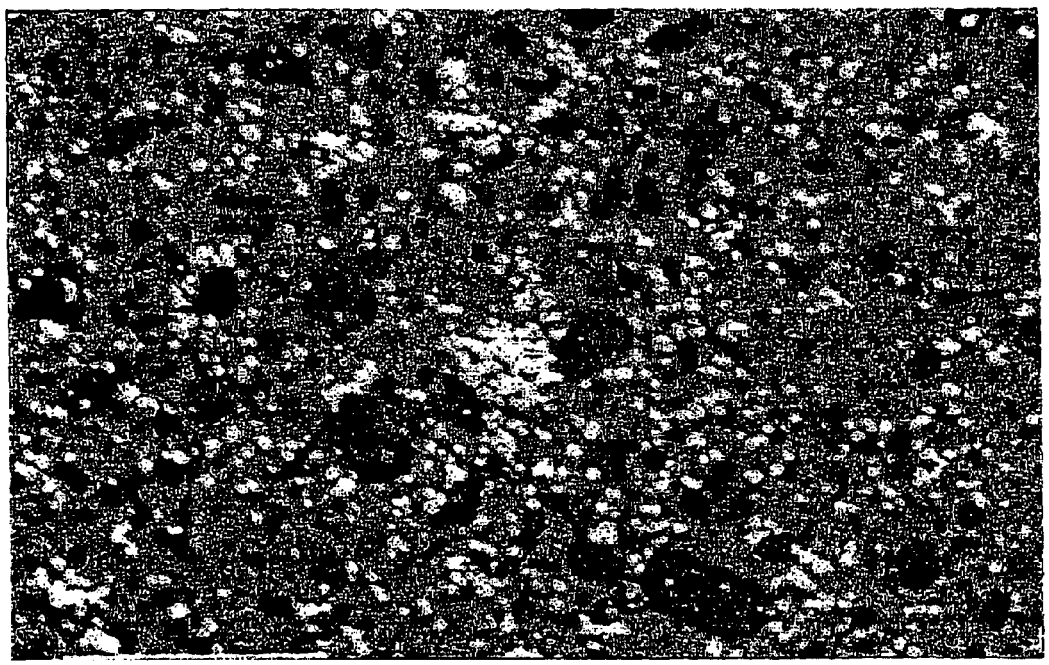
FIG. 2 is an electron micrograph showing a typical microstructure of an X—Ba—Cu—U—O material prepared in Example 1.

The microstructure of the resultant crystal is shown in FIG. 2, taken on a Cameca Sx50, scanning electron microscope, supplied by Cameca. Bright in contrast areas shown approximately where the uranium-containing phase particles are, and dark in contrast particles show approximately where the Y-211 phase particles are; grey in contrast shows the matrix Y-123 superconducting material.

In particular, it was found that the resultant crystal provides the effect of strong magnetic fields within the doped structure compared to crystals produced by known uranium-doping processes and the top-seed processing procedure enabled a highly efficient and accelerated process including temperature optimisation, which led to superior quality and superior effect crystals.

Figure 3:
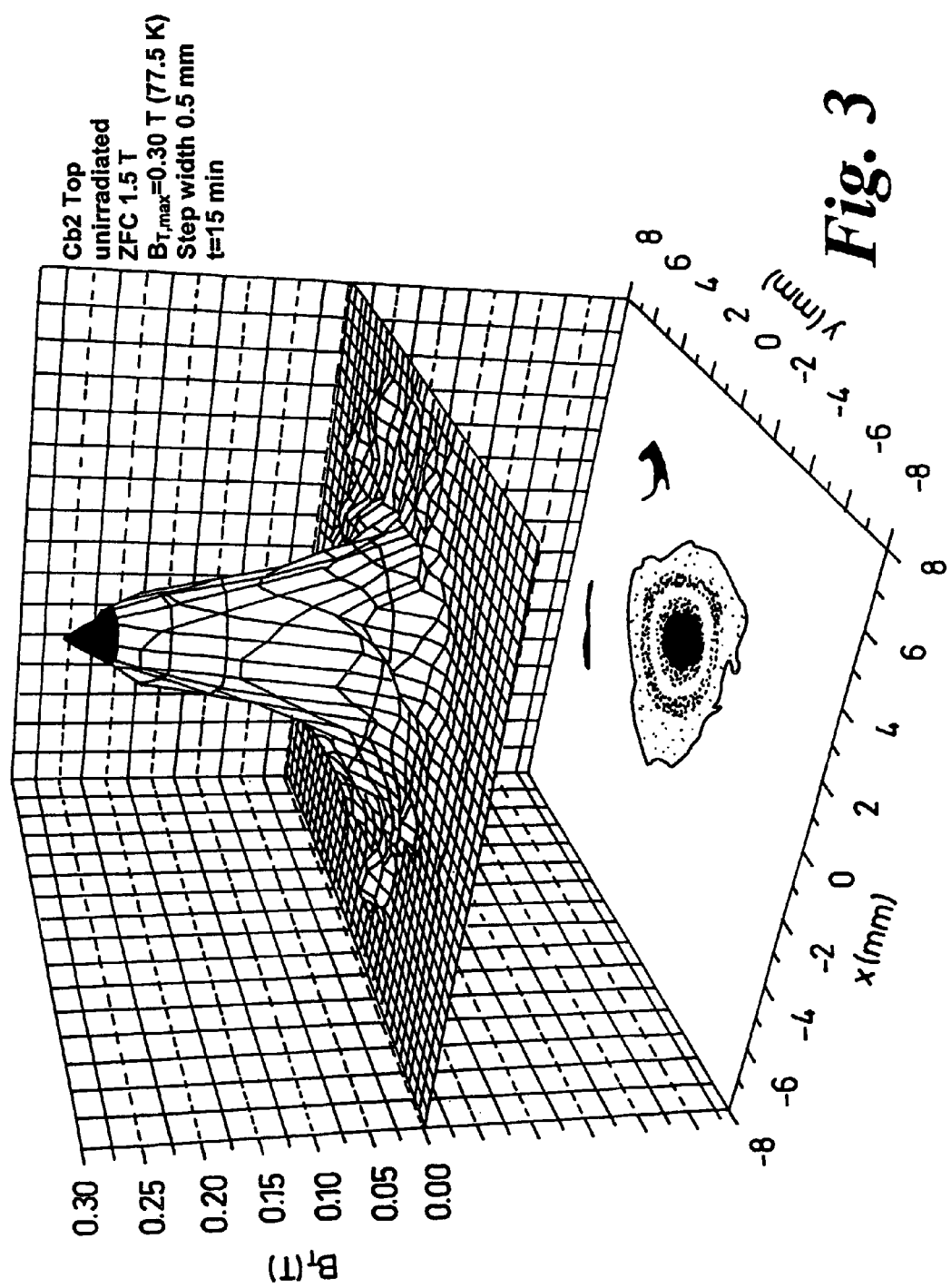
FIG. 3 illustrates a trapped field profile of a 36 mm² single grain superconductor described in Example 1.

FIG. 3 illustrates a trapped field profile of the crystal produced in Example 1, taken using a custom-made apparatus, comprising a magnet, power supply, X-Y-Z scanner and Hall probe. A single grain superconductor of Example 1 was magnetised under 1.5T magnetic field and then the field removed. The trapped field was measured using a Hall probe supplied by Arepoc Ltd, Slovakia, on the X-Y plane (top surface) of the sample surface, at 0.5 mm from the top surface.

EXAMPLE 2

The method of Example 1 was repeated but with a powdered mixture of 70% Y123, 20 mol % Y-211, 10 mol % $Y_2O_3$ and 0.5% w/w DU. The resultant crystal was found to achieve even further improved overall performance such as stronger magnetic fields, and the enablement of partial or partial oxygenation of the material during the growing stage, as compared with Example 1.

In both the examples described above, it was found possible to dispense addition of platinum, generally used in the production of XBCO, uranium-doped superconducting crystals, without any detrimental effect to the properties of the crystals produced.

In further experiments, the DU component was replaced with uranium containing particles having the following formulas

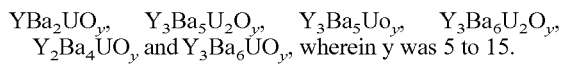
$Y_2Ba_4UO_y$, and $Y_3Ba_6UO_y$, wherein y was 5 to 15.

Uranium-doped superconducting crystals produced by the method of Example 1 with the above mentioned further uranium containing compounds were synthesised and tested, and each was found to exhibit the same excellent magnetic flux properties of the crystals produced in Example 1 and 2.

In yet further experiments, replacing the uranium in the X—Ba—Cu—U—O or X—Ba—U—O material from Example 1 with an equivalent amount of an element selected from Nb, Ta, Mo, W, Zr, Hf, Pt, Ag, Ru and Sn yielded superconducting crystals effecting relatively strong magnetic fields within the doped structure compared to crystals produced by known doping processes.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extend to any novel one, or any novel combination, of the features disclosed in this specification (including any accompanying claims, abstract and drawings), or to any novel one, or any novel combination, of the steps of any method or process so disclosed.

The invention claimed is:

1. A method of manufacturing a doped X—Ba—Cu—O material, the method comprising the steps of:
   a) mixing an X—Ba—Cu-L-O material with an X—Ba—Cu—O material; and
   b) crystallising the mixture;
   wherein
   each X is independently selected from a rare earth (Group IIIB) element, yttrium, a combination of rare earth elements, or a combination of yttrium and a rare earth element; and each L is one or more elements selected from U, Nb, Ta, Mo, W, Zr, Hf, Ag, Pt, Ru and Sn,
   wherein the X—Ba—Cu-L-O material comprise material of general formula:

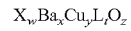

wherein each X and L is as defined hereinabove; and wherein w is 1, 2 or 3; x is 2 to 4; y is 0.1 to 1; t is 0.5 to 1; and z is 4 to 15.

2. A method of manufacturing a doped X—Ba—Cu—O material as claimed in claim 1 wherein the X—Ba—Cu—O material comprises material of the general formula

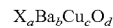

wherein each X is as defined hereinabove, and wherein a is 1 to 4; b is 1 to 6; c is 0.5 to 4; d is 3 to 20.

3. A method of manufacturing a doped X—Ba—Cu—O material as claimed in claim 2, wherein a is 1, 2 or 3; b is 2 to 4; c is 1 to 3; and d is 4 to 15.

4. A method of manufacturing a doped X—Ba—Cu—O material as claimed in claim 2 wherein the $X_aBa_bCu_cO_d$ is added in step (a) to an amount of at least 50% w/w of the mixture.

5. A method of manufacturing a doped X—Ba—Cu—O material as claimed in claim 2 wherein step (b) comprises crystallisation as a mixture of $X_wBa_xCu_yL_tO_z$ in molten $X_aBa_bCu_cO_d$.

6. A method of manufacturing a doped X—Ba—Cu—O material as claimed in claim 2 wherein step (b) comprises providing in a receptable a mixture of $X_aBa_bCu_cO_d$ and $X_wBa_xCu_yL_tO_z$; melting the mixture; providing a seed or key to the receptacle; and subsequently manipulating the temperature of, or in the region of, the seed or key, to induce crystallisation of the molten mixture.

7. A method of manufacturing a doped X—Ba—Cu—O material as claimed in claim 6 wherein the $X_aBa_bCu_cO_d$ and $X_wBa_xCu_yL_tO_z$ is added to the receptacle in solid form and the mixture melted.

8. A method of manufacturing a doped X—Ba—Cu—O material as claimed in claim 6 wherein the $X_aBa_bCu_cO_d$ is melted in the receptacle and solid $X_wBa_xCu_yL_tO_z$ is added to the molten material.

9. A method of manufacturing a doped X—Ba—Cu—O material as claimed in claim 6 wherein the seed or key is added to the molten mixture or added prior to melting the mixture.

10. A method of manufacturing a doped X—Ba—Cu—O material as claimed in claim 9 wherein the seed or key is a crystal of compatible crystallographic and chemical structure to the $X_aBa_bCu_cO_d$.

11. A method of manufacturing a doped X—Ba—Cu—O material as claimed in claim 9 wherein the seed crystal is the identical $X_aBa_bCu_cO_d$ material or $X_aBa_bCu_cO_d$ material with a different X atom to the $X_aBa_bCu_cO_d$ material being crystallised.

12. A method of manufacturing a doped X—Ba—Cu—O material as claimed in claim 1, wherein each X is independently selected from one or more of Y, Nd, Sm, Gd, Eu and Ho.

13. A method of manufacturing a doped X—Ba—Cu—O material as claimed in claim 1 wherein the $X_wBa_xCu_yL_tO_z$ is added in step (a) to an amount of at least 0.01% w/w of the total weight of the mixture produced in step (a).

14. A method of manufacturing a doped X—Ba—Cu—O material as claimed in claim 1 wherein the $X_wBa_xCu_yL_tO_z$ is a solid.

15. A method of manufacturing a doped X—Ba—Cu—O material as claimed in claim 1 wherein step (b) comprises single crystallisation.

16. A method of manufacturing a doped X—Ba—Cu—O material as claimed in claim 1 wherein the resultant doped X—Ba—Cu—O crystal is annealed at between 400° C. and 700° C.

17. A method of manufacturing a doped X—Ba—Cu—O material as claimed in claim 1 further comprising mixing $Y_2O_3$ with the mixture produced in step (a).

18. A method of manufacturing a doped X—Ba—Cu—O material as claimed in claim 1 further comprising adding Pt to the mixture produced in step (a).

* * * * *